United States Patent
Singleton et al.

(10) Patent No.: US 8,922,950 B2
(45) Date of Patent: Dec. 30, 2014

(54) MULTI-LAYER MAGNETORESISTIVE SHIELD WITH TRANSITION METAL LAYER

(75) Inventors: Eric W. Singleton, Maple Plain, MN (US); Jae-Young Yi, Prior Lake, MN (US); Kaizhong Gao, Eden Prairie, MN (US); Dimitar V. Dimitrov, Edina, MN (US); Dian Song, Eden Prairie, MN (US); Vladyslav A. Vas'ko, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/102,615

(22) Filed: May 6, 2011

(65) Prior Publication Data

US 2012/0281319 A1 Nov. 8, 2012

(51) Int. Cl.

| G11B 5/39 | (2006.01) |
|---|---|
| G11B 5/11 | (2006.01) |
| G01R 33/09 | (2006.01) |
| H01L 43/02 | (2006.01) |
| H01L 43/08 | (2006.01) |

(52) U.S. Cl.
CPC .......... *G11B 5/3912* (2013.01); *G01R 33/093* (2013.01); *G11B 5/3932* (2013.01); *G11B 5/398* (2013.01); *H01L 43/02* (2013.01); *H01L 43/08* (2013.01)
USPC ........................................................ 360/319

(58) Field of Classification Search
CPC ............................ G11B 5/3912; G11B 5/3932
USPC ........................................................ 360/319
See application file for complete search history.

(56) References Cited

U.S. PATENT DOCUMENTS

| 5,576,914 | A | 11/1996 | Rottmayer et al. |
|---|---|---|---|
| 6,266,218 | B1 * | 7/2001 | Carey et al. ............. 360/324.12 |
| 6,903,906 | B2 * | 6/2005 | Morinaga et al. ........ 360/324.12 |
| 7,023,671 | B2 * | 4/2006 | Gill .......................... 360/324.12 |
| 7,035,062 | B1 | 4/2006 | Mao et al. |
| 7,050,277 | B2 * | 5/2006 | Gill et al. ................. 360/324.12 |
| 7,099,123 | B2 * | 8/2006 | Gill et al. ................. 360/324.12 |
| 7,154,714 | B2 * | 12/2006 | Fukui et al. .............. 360/324.12 |
| 7,158,351 | B2 * | 1/2007 | Nakamoto et al. ............ 360/319 |
| 7,177,122 | B2 | 2/2007 | Hou et al. |
| 7,218,485 | B2 * | 5/2007 | Hasegawa et al. ....... 360/324.12 |
| 7,230,803 | B2 * | 6/2007 | Morinaga et al. ........ 360/324.12 |
| 7,265,951 | B2 * | 9/2007 | Gill .......................... 360/327.23 |
| 7,295,401 | B2 | 11/2007 | Jayasekara et al. |
| 7,369,360 | B2 | 5/2008 | Vas'ko et al. |
| 7,369,374 | B2 | 5/2008 | Gill et al. |
| 7,446,979 | B2 * | 11/2008 | Jayasekara .................... 360/319 |
| 7,599,151 | B2 * | 10/2009 | Hatatani et al. ............... 360/319 |
| 7,615,996 | B1 | 11/2009 | Machita et al. |
| 8,089,734 | B2 * | 1/2012 | Miyauchi et al. ............. 360/319 |
| 2002/0159201 | A1 | 10/2002 | Li et al. |
| 2003/0174446 | A1 | 9/2003 | Hasegawa |
| 2003/0189802 | A1 | 10/2003 | Morinaga et al. |
| 2004/0047087 | A1 | 3/2004 | Fukui et al. |
| 2004/0100737 | A1 | 5/2004 | Nakamoto et al. |

(Continued)

*Primary Examiner* — Craig A. Renner
(74) *Attorney, Agent, or Firm* — Hall Estill Attorneys at Law

(57) ABSTRACT

A magnetic shield that is capable of enhancing magnetic reading. In accordance with various embodiments, a magnetic element has a magnetically responsive stack shielded from magnetic flux and biased to a predetermined default magnetization by at least one lateral side shield that has a transition metal layer disposed between first and second ferromagnetic layers.

11 Claims, 5 Drawing Sheets

(56) References Cited

U.S. PATENT DOCUMENTS

| | | |
|---|---|---|
| 2004/0141261 A1 | 7/2004 | Hasegawa et al. |
| 2005/0157431 A1 | 7/2005 | Hatatani et al. |
| 2006/0018055 A1 | 1/2006 | Haginoya et al. |
| 2009/0034132 A1 | 2/2009 | Miyauchi et al. |
| 2009/0180217 A1 | 7/2009 | Chou et al. |
| 2011/0051291 A1* | 3/2011 | Miyauchi et al. ............ 360/319 |
| 2012/0087045 A1* | 4/2012 | Yanagisawa et al. ......... 360/319 |
| 2012/0087046 A1* | 4/2012 | Yanagisawa et al. ......... 360/319 |

* cited by examiner

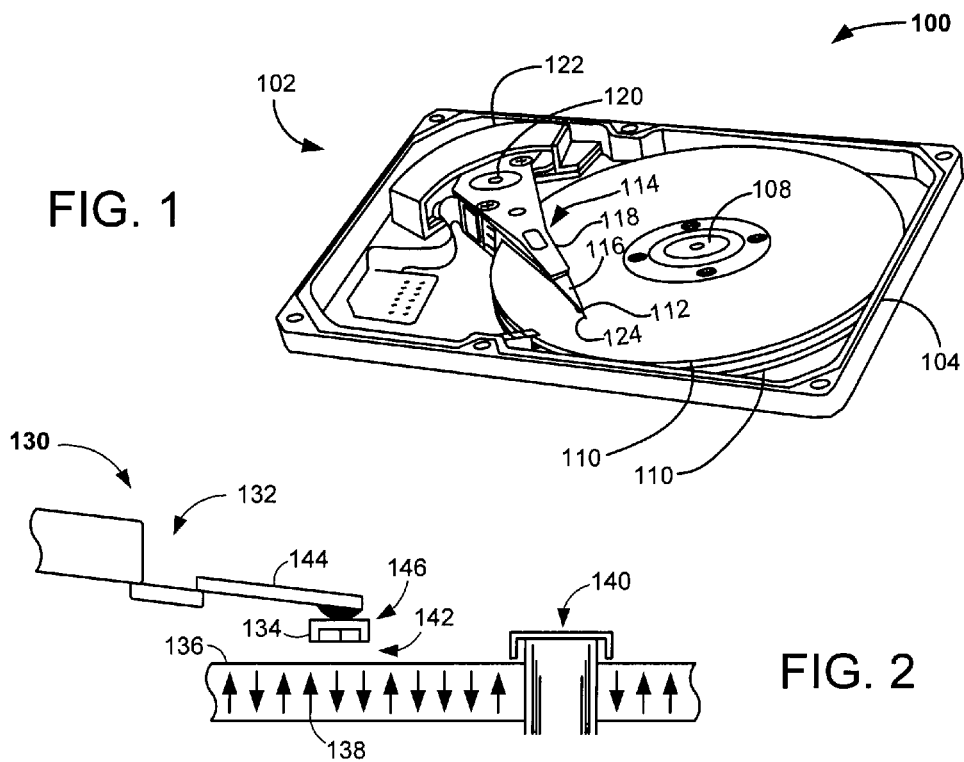
FIG. 1
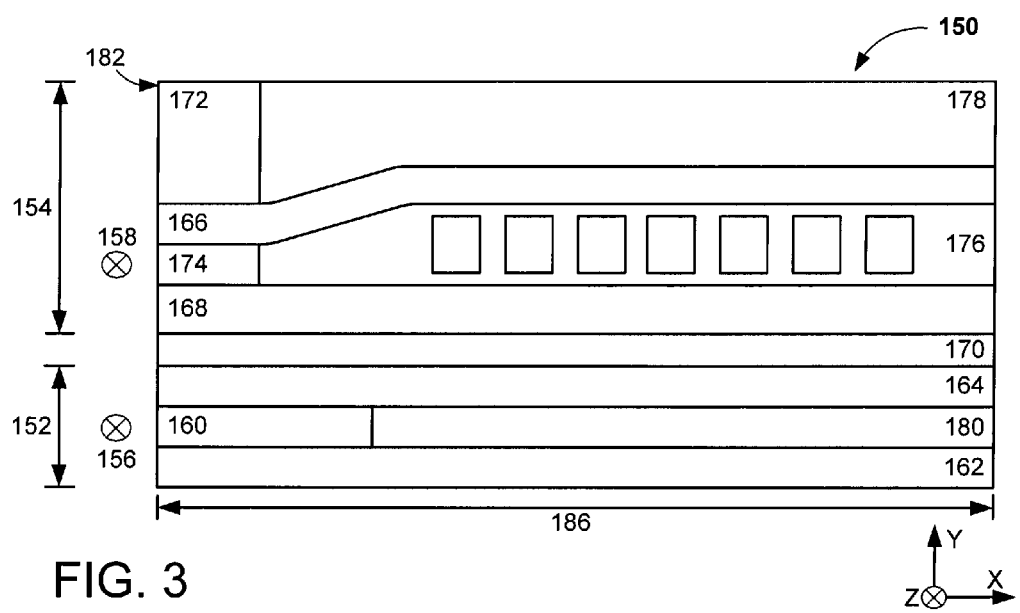
FIG. 2
FIG. 3

MULTI-LAYER MAGNETORESISTIVE SHIELD WITH TRANSITION METAL LAYER

SUMMARY

Various embodiments of the present invention are generally directed to a magnetic shield that may be capable of protecting a magnetoresistive element from unwanted magnetic flux. In accordance with various embodiments, a magnetic element has a magnetically responsive stack that may be shielded from unwanted magnetic flux and that may be biased to a predetermined default magnetization by at least one lateral side shield that has a transition metal layer disposed between a first and second ferromagnetic layer.

BRIEF DESCRIPTION OF THE DRAWINGS

FIG. 1 generally provides of a data storage device according to an embodiment.

FIG. 2 is a perspective view of a portion of a data storage device according to an embodiment.

FIG. 3 generally illustrates a magnetic element capable of being used in the portion of the data storage device displayed in FIG. 2.

DETAILED DESCRIPTION

Figure 4:
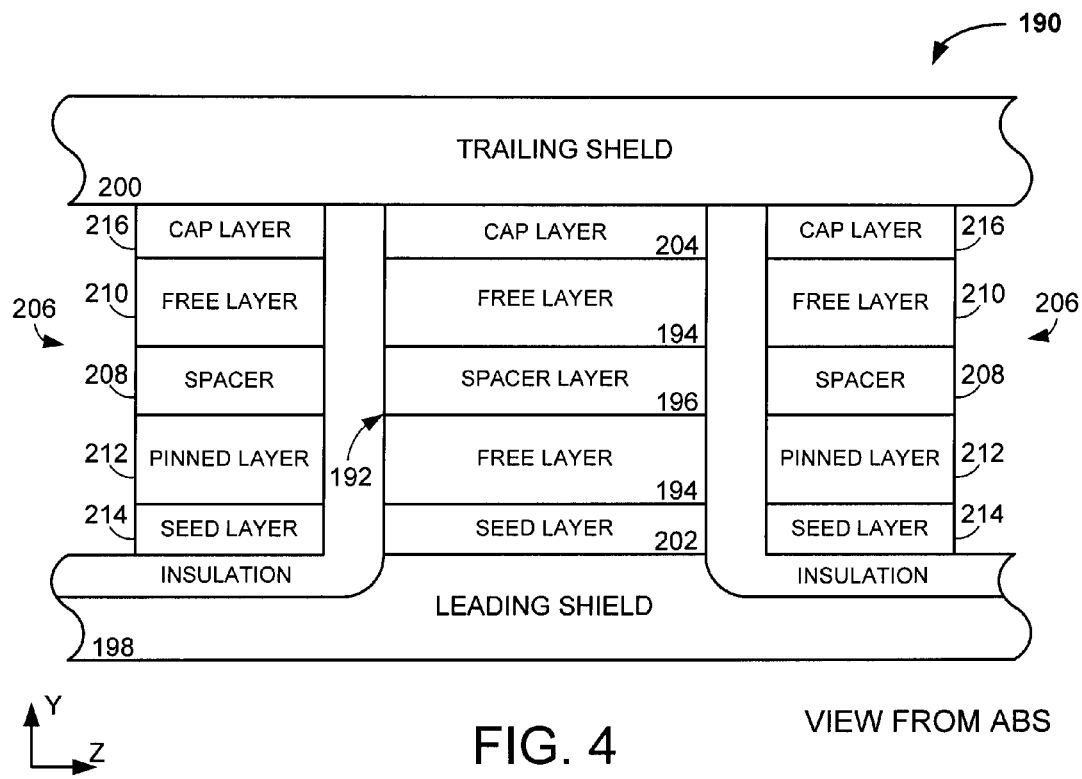
FIG. 4 shows a block representation of a magnetic element capable of being used in the magnetic element of FIG. 3.

The present disclosure generally relates to magnetic shields that may be capable of protecting a magnetoresistive (MR) element from unwanted magnetic flux. An increasing demand for higher data capacity has placed added emphasis on the amount of data written to a data storage media, which consequently results in a reduction in the size of data bits and magnetic shields. With smaller data bits, magnetic flux from nearby data tracks can be inadvertently sensed and cause reader inaccuracy. Likewise, smaller magnetic shields can lead to increased magnetic instability due to a reduced capability to fully protect the MR element from unwanted magnetic flux.

Accordingly, various embodiments of the present invention are generally directed to a magnetoresistive (MR) element that has a magnetically responsive stack that may be shielded from unwanted magnetic flux and that may be biased to a predetermined default magnetization by at least one lateral side shield. The lateral side shield is constructed as a lamination of at least a transition metal layer disposed between a first and second ferromagnetic layer wherein shielding and biasing for the magnetic stack may be concurrently provided. Such a laminated lateral side shield may allow for enhanced MR element operation through the cross-track capability and better magnetic stability.

While a shielded and biased magnetic element may be used in a variety of non-limiting applications, FIG. 1 provides a data storage device 100 that is capable of utilizing a magnetic element according to an embodiment. The device 100 is provided to show an environment in which various embodiments of the present invention may be practiced. It will be understood, however, that the claimed invention is not so limited.

The device 100 includes a substantially sealed housing 102 formed from a base deck 104 and top cover (not shown). An internally disposed spindle motor 108 is configured to rotate by one or more storage media 110. The media 110 are accessed by a corresponding array of data transducers that are each supported by a head gimbal assembly (HGA) 112. Each HGA 112 can be supported by a head-stack assembly 114 ("actuator") that includes a flexible suspension 116, which in turn is supported by a rigid actuator arm 118. In an embodiment, the actuator 114 pivots about a cartridge bearing assembly 120 through application of current to a voice coil motor (VCM) 122.

In this way, controlled operation of the VCM 122 causes the transducers 124 of the HGA 112 to align with tracks (not shown) defined on the media surfaces to store data thereto or retrieve data therefrom. An ability to decrease the width of the tracks while maintaining proper alignment of the transducers 124 may be accomplished by decreasing the operational width of at least one transducing magnetic element. Thus, the device 100 may have increased capacity through the incorporation of transducing elements with reduced operational width which corresponds to a finer areal resolution.

An example data transducing portion 130 of the data storage device 100 of FIG. 1 is displayed in FIG. 2. The transducing portion 130 has an actuating assembly 132 that positions a transducing head 134 over a magnetic storage media 136 that is capable of storing programmed bits 138. The storage media 136 is attached to a spindle motor 140 that rotates during use to produce an air bearing surface (ABS) 142 on which a slider portion 144 of the actuating assembly 132 flies to position a head gimbal assembly (HGA) 146, which includes the transducing head 134, over a portion of the media 136.

The transducing head 134 may include one or more transducing elements, such as a magnetic writer and magnetically responsive reader, which operate to program and read data from the storage media 136, respectively. As a result, controlled motion of the actuating assembly 132 causes the transducers to align with tracks (not shown) defined on the storage media surfaces to write, read, and rewrite data. However, the reduction in track widths that corresponds with ever decreasing data bit sizes can induce reading inaccuracies when the magnetic flux from an adjacent track is sensed inadvertently. In view of the susceptibility to proximal data bits 138, a magnetic element of the transducer has one or more shields that function to absorb unwanted magnetic flux so that only certain data bits 138 on a predetermined data track are written and read.

An example transducing head 150 that employs magnetic shields is generally displayed as a cross-sectional block representation in FIG. 3. The head 150 can have one or more magnetic transducing elements, such as the magnetic reader 152 and writer 154, which can operate individually, or concurrently, to write data to or retrieve data from an adjacent storage media, such as media 136 of FIG. 2. Each magnetic element 152 and 154 is constructed with multiple magnetic shields and transducing elements that independently define predetermined read and write tracks that each have a predetermined track width 156 and 158 that extend along a Z axis going into and out of the page.

As displayed, the magnetic reading element 152 has a magnetoresistive reader layer 160 disposed between leading and trailing shields 162 and 164. Meanwhile, the writing element 154 has a write pole 166 and a return pole 168 that create a writing circuit to impart a certain magnetic orientation to the adjacent storage media. The return pole 168 is separated from the read element 152 by a gap layer 170 of non-magnetic material while the write pole 166 is disposed between a downtrack shield 172 and an uptrack shield 174 that maintains separation of the write and return poles 166 and 168.

Additional insulating layers 176, 178, and 180 respectively surround the write pole 166 and MR reader layer 160 to prevent leakage of magnetic flux within the transducing head 150. The various shields and insulating materials about each magnetic element 152 and 154 provide similar focusing of magnetic fields, but the shields on the ABS 182 are configured to focus magnetic fields within the predetermined tracks 156 and 158. That is, the insulating materials 176 and 178 focus magnetic fields on the write pole 166 while the shields 162, 164, 172, and 174 each may prevent the migration of magnetic fields outside the predetermined tracks 156 and 158.

The shields of the transducing head 150 can be characterized by their position with respect to the timing of encountering external bits, such as bits 138 of FIG. 2. In other words, the shields that encounter the external bits before the transducing elements 152 and 154 are "leading" shields while shields that see the bits after the transducing elements are "trailing" shields. Such characterization extends to the difference between "upstream" or "downstream" of the transducing elements in that, depending on the direction of travel for the head 150 and external bits, the shields can be either leading or trailing and either upstream or downstream.

The transducing head 150, and each of the respective layers, has a predetermined thickness measured along a Y axis, and a stripe height 186 measured along an X axis. While not required or limited, the shields 162, 164, and 172 may have respective shapes and dimensions that do not vary along the stripe height 186. As such, each shield can be configured to maintain a predetermined thickness throughout the extent of each shield's stripe height.

With the predetermined track width 158 getting smaller to allow more densely programmed bits on a storage media, more precise definition of the track 158 is used with a reduced physical head 150 size, which can consequently correspond to a greater sensitivity to unwanted magnetic fields, particularly from lateral magnetic fields from adjacent data tracks. The reduced head 150 topography can further introduce magnetic instability through magnetic domain generation and movement near the data track edge due to narrow shield-to-shield spacing.

Accordingly, lateral shields can be constructed to supplement the leading and trailing shields 162 and 164 to surround the MR element 160 and better focus magnetic flux to more precisely define data tracks 156 and 158. Such lateral magnetic shields are generally illustrated as a block representation in the example magnetic element 190 of FIG. 4, as shown from the air bearing surface (ABS). The cross-sectional view of the magnetic element 190 in FIG. 4 displays an MR reader portion, which may accompany an MR writer as shown in FIG. 3.

The MR element 190 has a magnetic stack 192 that is magnetically responsive and capable of sensing data bits that can be interpreted by a host as various logical states. It has been observed that a magnetic stack 192 that has dual ferromagnetic free layers 194 separated by a non-magnetic spacer layer 196 can provide beneficial data sensing in conjunction with reduced shield-to-shield spacing.

The stack 192 is coupled to leading and trailing shields 198 and 200 that respectively maintain a predetermined uptrack and downtrack resolution of data bits. The magnetically sensitive region of the stack 192 is decoupled from the magnetically active leading and trailing shields 198 and 200 by seed and cap layers 202 and 204 that are not required or limited to the configuration shown in FIG. 4. However, the leading and trailing shields 198 and 200 may provide cross-track data bit resolution used to reliably read high areal density data recordings. Such cross-track resolution can be enhanced by the addition of laminated side shields 206 that are laterally adjacent and non-contacting with the stack 192. In some embodiments, insulating material is positioned between each side shield 206 and the leading shield 198 to prevent any current from traveling through the side shields 206 instead of the stack 192.

In operation, a default magnetization is set to one or both of the free layers 194 with a biasing structure, such as a hard magnet, that is external to the stack 192 and that may allow sensed data bits to induce a change in the relative angle between the free layers 194 that is read as a logical state by a host. With each ferromagnetically free layers 194 not having a fixed magnetization in the stack 192 to set a default magnetization, a biasing structure can take the form of a rear mounted permanent magnet that sets the default magnetization from the portion of the stack 192 opposite the ABS. Such a rear mounted magnet can be associated with the formation of data track edge domain creation that combines with the relatively large demagnetization fields generated by the stack 192 to provide limited cross-track resolution optimization in high areal density data recordings.

In view of the cross-track resolution issues related to rear mounted biasing structures, the side shields 198 may provide both biasing and shielding operation that concurrently sets a predetermined default magnetization in the stack 192 and enhances cross-track data bit resolution by absorbing unwanted magnetic flux. Each of the side shields 206 in FIG. 4 have a spacer layer 208 disposed between a free ferromagnetic layer 210 that is sensitive to encountered magnetic flux and a pinned ferromagnetic layer 212 that is set to a predetermined magnetization that is not sensitive to external magnetic flux due to being set to predetermined pinning magnetization.

The presence of both free and pinned magnetizations in each side shield 206 may allow for the shielding of magnetic flux distal to the magnetic stack 192 while providing a biasing magnetization that aids in setting a predetermined default magnetization in the stack 192. The shielding and biasing characteristics of the side shields 206 can be adjusted by aligning each layer of the side shield 206 with the layers of the stack 192, which can be facilitated by adding seed and cap layers 214 and 216 of particular thicknesses to opposite sides of the side shields 206. The aligned magnetizations of the side shields 206 and magnetic stack 192 can allow for stronger biasing of the stack 192 due to increased antiferromagnetic coupling that can be further tuned by adjusting the lateral distance between the side shield 206 and stack 192.

It should be noted that the shielding and biasing features of the side shields 206 can be modified and tuned in a number of different manners, none of which are required or limited to further enhance the cross-track resolution of the MR element 190. One such modification to the configuration of the side shields 206 is presented in the MR element 220 of FIG. 5A.

The element 220 has a magnetic reader stack 222 with laterally adjacent and non-contacting side shields 224 that are each constructed with a transition metal layer 226 disposed between the free and pinned ferromagnetic layers 228 and 230.

Figure 5A:
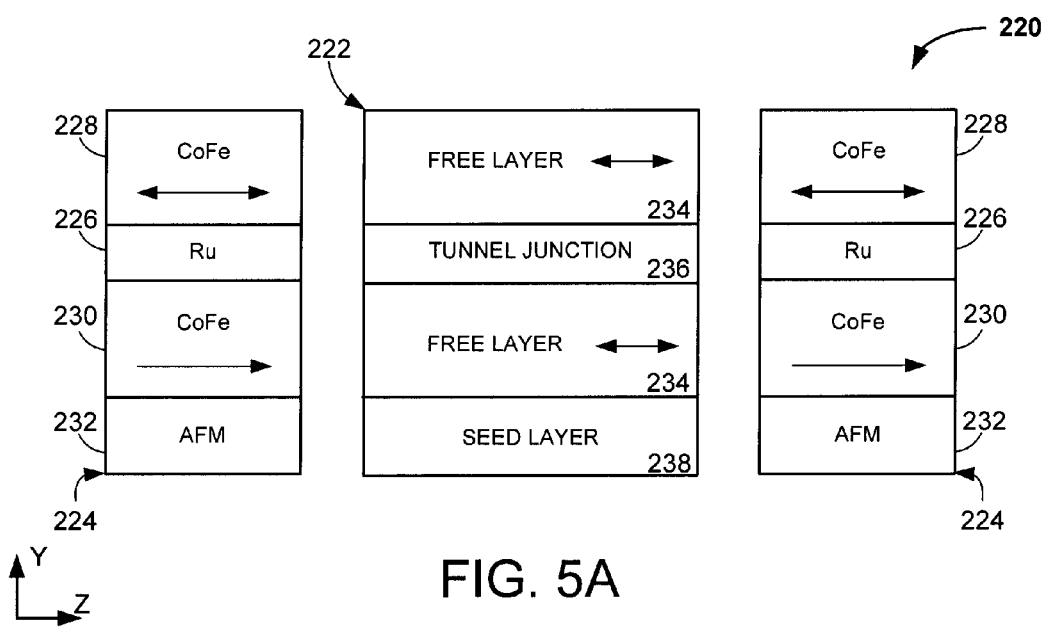
FIG. 5A displays a block representation of a portion of a magnetic element as viewed from an air bearing surface according to an embodiment.

As shown in the embodiment of FIG. 5A, the transition metal layers 226 are each Ruthenium (Ru) and each pinned and free layer 228 and 230 is CoFe. However, the material of the transition metal layers are not limited to the various embodiments shown in FIG. 5A. That is, any number of elements, compounds, and alloys can be used with either insulating or conductive and with or without Ruderman-Kittel-Kasuya-Yoshida (RKKY) coupling. For example, the transition metal layers 226 can individually or collectively be insulating compounds such as, but limited to, AlO and $SiO_2$, or metallic materials with no RKKY interactions, such as Ta, TaN, Ti, and TiN, between the pinned and free layer 228 and 230.

A predetermined magnetization direction is maintained in the pinned layers 230 by directly coupling an antiferromagnetic (AFM) layer 232 to each soft magnetic pinned layer 230 opposite the transition metal layer 226. These configurations, however, are not required or limited as a variety of transition metals, such as Ir, Rh, and Cu, and non-magnetic materials, such as MgO, can be used as the transition metal layer 226 of one or both side shields 224. Meanwhile, the free 228, pinned 230, and metal 226 layers can be characterized as a synthetic antiferromagnetic (SAF) structure that is comprised of various materials and thicknesses to provide both biasing and shielding for the magnetic stack 222 in an embodiment.

With side shields 224 laterally bookending the magnetic stack 222, the demagnetization energy of the dual free layers 234 of the stack 222 is minimized, which may result in a reduction or elimination of magnetic domain formation in the free layers 234 and an increased element 220 read back signal. The enhanced shielding of the side shields 224 may allow the free layers 234 of the magnetic stack 222 to be closer together due to a thinner tunnel junction layer 236 being disposed therebetween. Furthermore, the strength of the side shields 224 may allow for a reduction in the width of the shields 224, as measured along the Z axis, which can further lead to optimized read back capability in high linear and areal density data bit recordings due to a condensed element 220 width.

Configuring the side shields 224 as a SAF structure also may allow for optimized biasing of the stack 222 free layers 234 through the induction of substantially orthogonal magnetizations. That is, the biasing fields emitted from each side shield 224 may induce the free layers 234 to predetermined default magnetizations that are substantially orthogonal, which enhances reader accuracy and sensing speed. The biasing fields of the side shields 224 can be further aligned with the layers of the stack 222 with the inclusion of a seed layer 238 that may efficiently position the biasing fields of each shield 224 to induce such substantially orthogonal magnetizations in the stack 222.

Figure 5B:
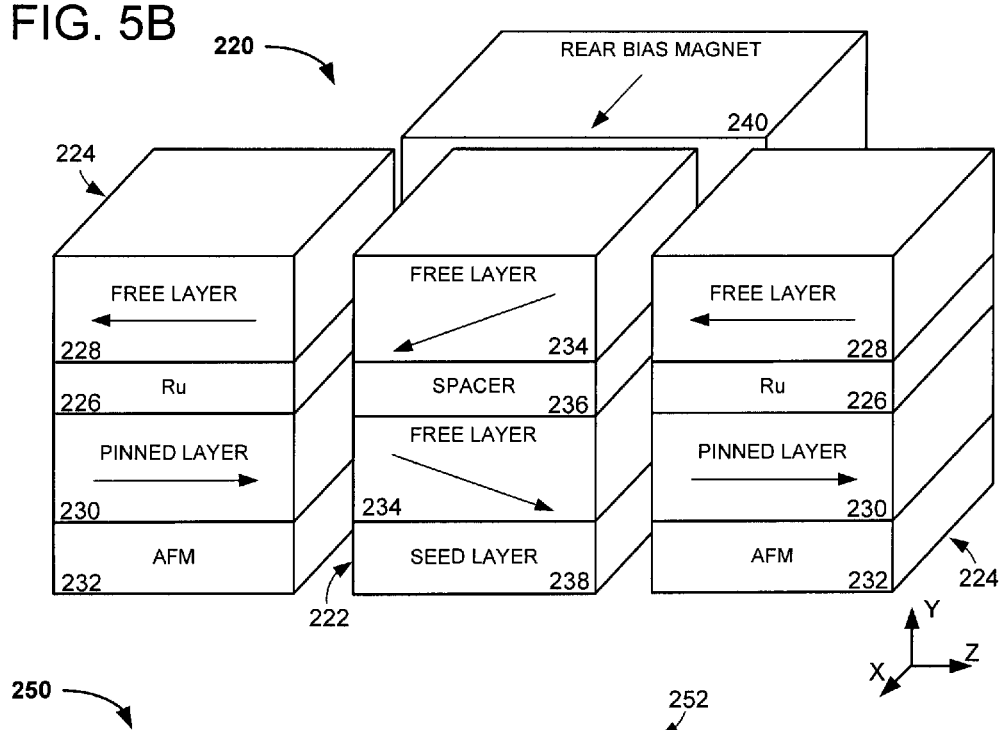
FIG. 5B shows an isometric view of the portion of the magnetic element of FIG. 5A.

The biasing of the magnetic stack 222 can be further aided by a rear magnet that is positioned on the opposite side of the stack 222 from the ABS, as shown in the isometric view of FIG. 5B. The magnetic element 220 shown in FIG. 5B is constructed with the magnetic stack 222 laterally flanked by laminated side shields 224 and positioned between the ABS and a rear bias magnet 240. By surrounding the magnetic stack 222 with biasing structures, the size and biasing strength output of each structure may be reduced, which optimizes the form factor of the element 220. The combination of the side shields 224 and rear bias magnet 240 further allows the side shields 224 to provide enhanced cross-track resolution with minimal biasing field specifications.

The construction of a rear bias magnet 240 in combination with the laminated side shields 224 also helps ensure the substantially orthogonal magnetization relationship between the stack free layers 234. While the rear bias magnet can be constructed as solid ferromagnet or as a lamination of magnetic layers, neither of which are required or limited, the effect of the biasing magnetization on the stack free layers 234 may reduce the generation of magnetic domains on the ABS due to the lowered magnetic biasing field specifications from the side shields 224.

Figure 6:
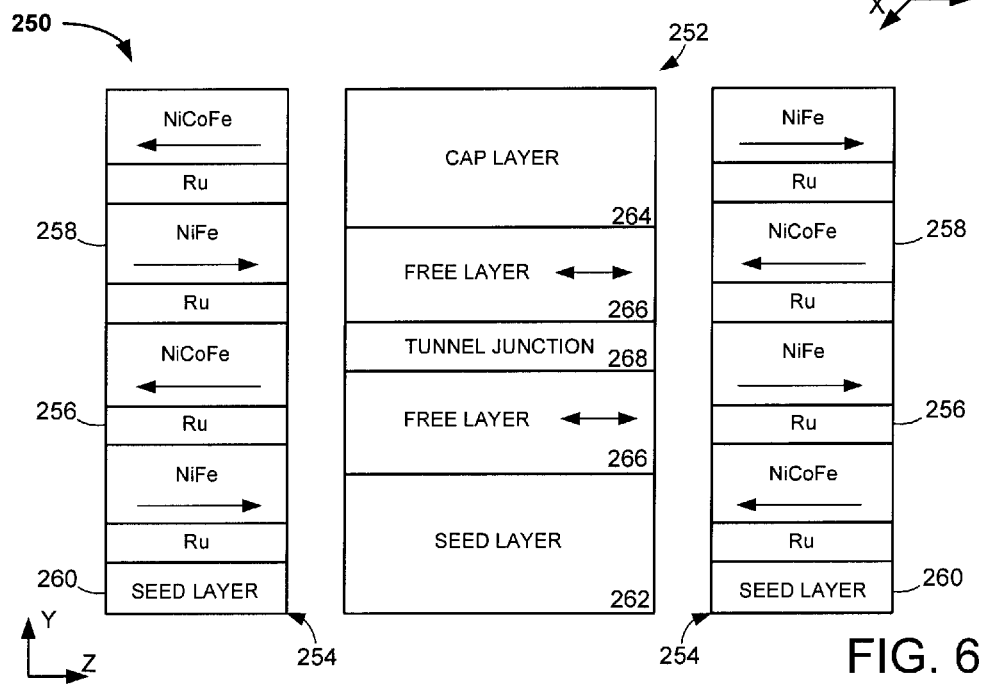
FIG. 6 displays a block representation of a portion of a magnetic element as viewed from an air bearing surface according to an embodiment.

In another example configuration of the side shields, FIG. 6 generally illustrates a portion of a magnetic element 250 that has a magnetic stack 252 disposed laterally between side shields 254 each constructed as a lamination of alternating transition metal layers 256 and soft magnetic free layers 258. The alternating lamination of the side shields 254 provides shielding for the magnetic stack 252. The free layers antiferromagnetically couple due to the exchange coupling between the soft magnetic free layers 258 and the transition metal layers 256 that can be adjusted to cater to a multitude of predetermined magnetic stack 252 operating parameters.

With higher data bit recording densities, the ability to precisely tune the shielding efficiency of side shields 254 may allow for smaller physical magnetic stack sizes that operate with reliability and accuracy. The tunable nature of the side shields 254 in FIG. 6 lies in the numerous variations of materials and thicknesses of the shield laminations. The example shield laminations 254 each have a common transition metal (Ru) constructed with a common first thickness and disposed between soft magnetic layers such as, but limited to, NiFe and NiCoFe that each has a common second thickness.

However, the shield laminations 254 of FIG. 6 are merely one embodiment which is not required or limited. As such, other embodiments can have varying transition metal materials and thicknesses that modify the exchange coupling of the free layers 258 and the shielding efficiency of the side shields 254. For example, the number of alternating layers and alignment with the magnetic stack 252 can be adjusted with shield seed layers 260 to attain predetermined operation.

The shield seed layers 260 can be configured in relation to seed and cap layers 262 and 264 of the magnetic stack 252 to position the various laminated layers of each shield 254 out of alignment with the stack free layers 266 and tunnel junction 268. The lack of alignment between the layers of the stack 252 and side shields 254 can modify the biasing field strength imparted on the stack 252 in combination with complete shielding coverage of each lateral surface of the magnetic stack 252.

Figure 7:
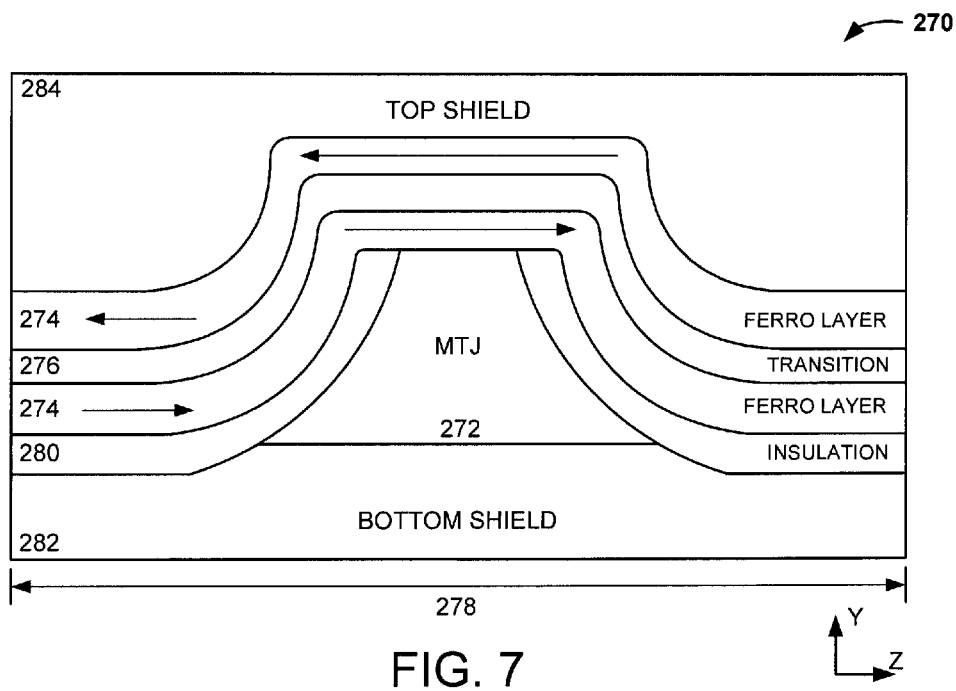
FIG. 7 presents a magnetic element as constructed and operated in accordance with various embodiments of the present invention.

While the lamination of the side shields 254 can provide enhanced operation and broadened configurability, the practical manufacture of a magnetic element with laminated side shields can pose difficulties. One such difficulty could be the deposition of side shield layers with uniform thicknesses. FIG. 7 generally illustrates a magnetic element 270 constructed to alleviate manufacturing difficulties while enhancing magnetic shielding and biasing.

The magnetic element 270 has laminated lateral side shields on either side of a magnetic tunnel junction (MTJ) 272 that are each constructed, in accordance with an example embodiment, with two ferromagnetic layers 274 of NiFe each with a 40 Angstrom thickness alternating with a Ru transition metal layer 276 that has a 20 Angstrom thickness. As displayed, the ferromagnetic and transition metal layers 274 and 276 of the side shield each continuously extends across the width 278 of the element 270.

The continuous configuration of the layers of the side shields allows for the maintenance of predetermined layer thicknesses, such as 20 or 40 Angstroms, near the MTJ 272. Such a configuration also allows a ferromagnetic layer 274 to extend along a substantial portion of the MTJ's sidewall, as measured along the Y axis. While the extension of a ferromagnetic layer 274 along the MTJ's sidewall may promote efficient magnetic shielding and reliable layer thicknesses with simplistic manufacturing processes, the MTJ 272 may be buffered from direct contact with the ferro layers 274 along its sidewall by an insulation layer 280.

The addition of the insulation layer 280 can supplement a dimension of tunability to the magnetic element 270. That is, the variation of the thickness and non-magnetic material of the insulation layer 280 can be modified to accommodate a variety of different shielding and biasing needs. The configuration of the insulation layer 280 can also be omitted from the top of the MTJ 272 so that at least one ferromagnetic layer 274 is in direct contact with the MTJ 272. With the additional thickness of the continuous side shield layers to the element 270, either leading or trailing shield 282 or 284 can have an area of reduced thickness in the form of a side shield feature that can accommodate the additional side shield layer thickness while maintaining a minimal shield-to-shield spacing. The side shield feature, while not limited to a certain shape or size, can be constructed as a notch, taper, and continuously curvilinear sidewall.

Figure 8:
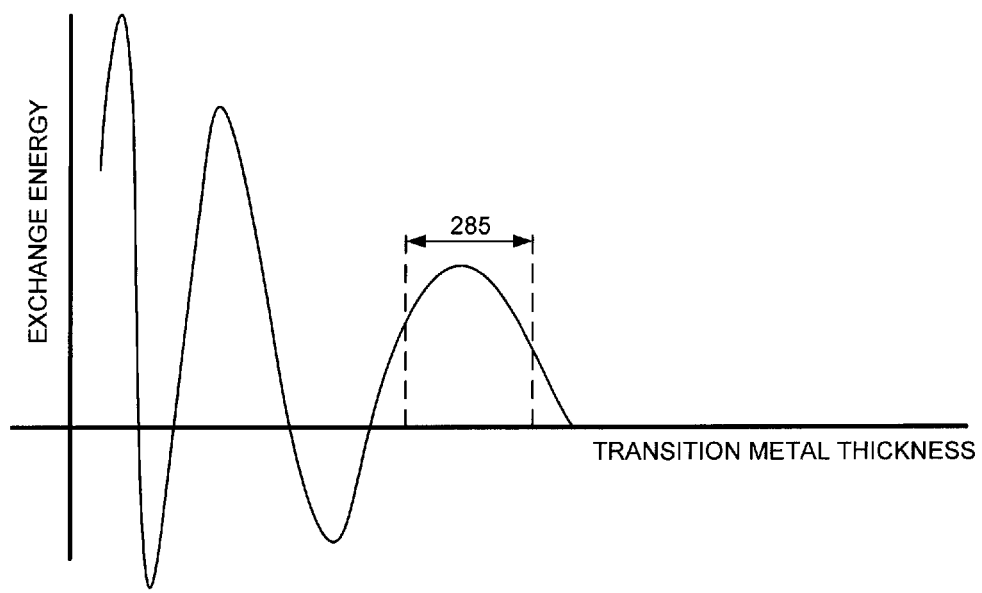
FIG. 8 graphs operational characteristics of a magnetic element as operated in accordance with various embodiments of the present invention.

However, the deposition of the side shield layers may be optimized to ensure proper biasing and shielding of the MTJ 272. FIG. 8 graphs example operational characteristics of a magnetic element, such as the element 270 of FIG. 7, to illustrate how the side shield layers can be optimized.

In operation, a laminated side shield, such as the shields of FIGS. 4-6, will have varying exchange coupling energy depending on the side shield design, particularly with regard to the transition metal layer thickness. FIG. 8 graphs example variations in exchange coupling energy which forms at least three defined peaks as transition metal layer thickness increases. As a result of the varying exchange coupling energy, construction of a side shield with a transition metal layer thickness that corresponds with exchange coupling energy that is too high, or too low, may reduce the shielding and biasing operation of the side shield.

While any transition metal layer thickness can be used, an optimal exchange coupling thickness region 285 can be used in various embodiments where the side shields will continuously antiferromagnetically couple to bias and shield the adjacent MTJ. A transition metal layer thickness that is outside the region 285 can correspond with the generation of magnetic domains due to some portions of the side shields antiferromagnetically coupling while other portions ferromagnetically coupling. Hence, an optimal transition metal thickness region 285 provides the bounds of transition metal thickness to remain within the predetermined third exchange energy peak.

Constructing the side shields with uniform side shield layers that have a predetermined thickness that correlates with the third antiferromagnetic exchange energy peak can provide enhanced readback head operation. In some embodiments the thickness of the transition metal layer varies along the entire width of the element, but provides enhanced operation when the thinnest portion of the transition metal layer near the MTJ is within the third peak region 285.

Figure 9:
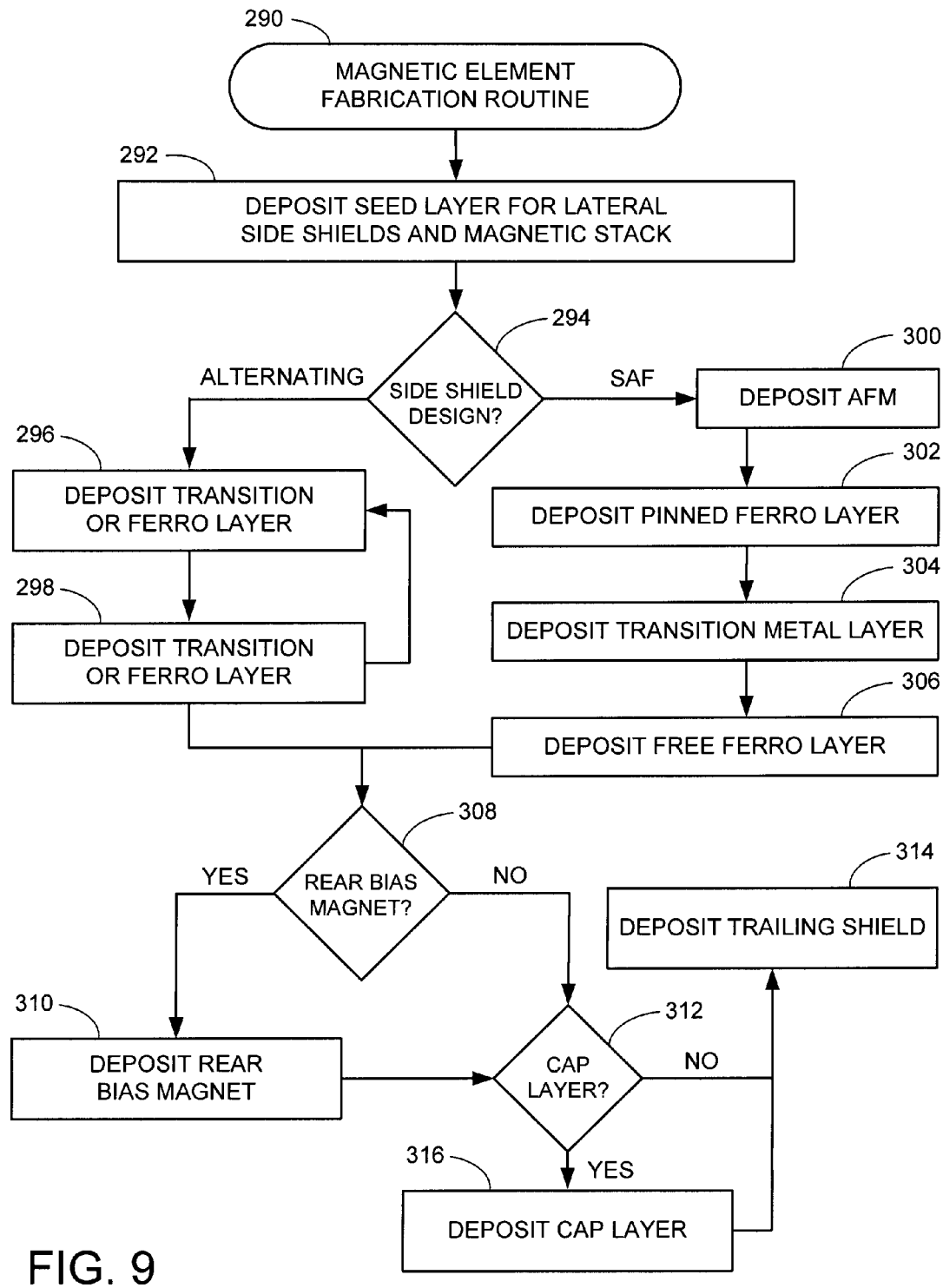
FIG. 9 provides a flowchart mapping a MAGNETIC ELEMENT FABRICATION routine conducted in accordance with various embodiments of the present invention.

An example magnetic element fabrication routine 290 that can produce a magnetic element with an optimized side shield in accordance with various embodiments of the present invention is presented in the flow chart of FIG. 9. The routine 290 begins by depositing one or more seed layer(s) in step 292 that define a predetermined size and configuration of the magnetic element. While the seed layers can be deposited on a pre-deposited leading shield layer, such a shield layer is not required for the seed layers to define a magnetic stack and side shields on either lateral side of the stack. The deposition of the seed layers in step 292 also defines the distance between the side shields and the stack, which can play a role in the biasing and shielding characteristics of the side shields.

The routine 290 next determines the side shield design in decision 294 by evaluating whether an alternating lamination of layers and a synthetic antiferromagnetic (SAF) lamination. As discussed above, either side shield lamination can provide concurrent magnetic stack biasing and shielding with minimal increased shield-to-shield spacing. If an alternating lamination is chosen in decision 294, the routine 290 proceeds to step 296 to deposit either a transition metal layer or a ferromagnetic layer onto the seed layer(s). Next in step 298, the layer not deposited in step 296 is deposited. It should be noted that the deposition of different layers can be associated with separate mask and etch operations that define each material layer's thickness, shape, and orientation.

After step 298, another transition metal and ferromagnetic layer combination can be deposited by looping through steps 296 and 298 any number of times. With a number of alternating side shield layers deposited in a selected ratio, such as a two-to-one ferromagnetic to transition layer ratio, the routine 290 can move forward with the alternating lamination of ferromagnetic and transition metal layers present on the seed layer. However, if in decision 294 a SAF structure is sought, step 300 would deposit an antiferromagnetic AFM material layer followed by the deposition of a ferromagnetic layer in step 302 that contacts and is pinned by the AFM layer.

Subsequently in steps 304 and 306, a transition metal layer and ferromagnetic free layer are deposited on the pinned layer to form a SAF structure with both a set magnetization in the pinned layer and an external magnetic field sensitive free layer that are separated by the transition metal layer. The configuration of a SAF structure on each lateral side of the magnetic stack can, as discusses above, provide reduced spacing between shielding layers, which results in readback capabilities. Although not explicitly stated in routine 290, the magnetic stack comprising of dual ferromagnetic free layers separated by a non-magnetic spacer layer can be deposited concurrently, prior to, or subsequent to the deposition of side shield layers in steps 296-306. Regardless of the design and configuration of the side shields, once formed the routine 290 advances to decision 308 where the inclusion of a rear bias magnet, such as the magnet 240 of FIG. 5B, is determined. A decision for a rear bias magnet then proceeds to step 310 which deposits the bias magnet near the magnetic stack opposite the ABS surface of the stack.

A determination that no rear bias magnet is needed results in an evaluation of the inclusion of a cap layer in decision 312. Thus, decision 312 is determined with or without a rear bias magnet being present in the magnetic element. In yet, in some embodiments, the cap layer can be deposited before forming the rear bias magnet. With respect to the cap layer determination of decision 312, a lack of any need for a cap layer leads to the deposition of a trailing shield in step 314 over some or all of the magnetic stack and side shields. Meanwhile, a desire for a cap layer advances to the deposition of a trailing shield after depositing a cap layer in step 316.

With the various decisions and possible configurations of the stack, side shields, and rear bias magnet in routine 290, it can be appreciated that none of the blocks and decisions are required or limited. As such, the routine 290 can be adjusted, much like the configurations and materials of the many layers, to accommodate the construction of a magnetic element that operates in a fashion. For example, the thickness of seed layers in step 292 can vary between the side shields and stack, as generally shown in FIG. 6, which can involve a multitude of seed layer deposition steps in place of the one step shown in FIG. 9.

In another example modification of routine 290, the alignment and materials can vary in a particular side shield or in the entire element, which corresponds with numerous additional steps in routine 290 to form the side shields with the alignment and material configurations. Thus, the routine 290 is not required or limited as the various decisions and steps can be omitted, changed, and added as desired to construct a magnetic element with side shields that both bias and shield the magnetic stack.

It can be appreciated that the configuration and material characteristics of the laminated magnetic shields described in the present disclosure allows for enhanced magnetic data bit reading through the reduction or elimination of magnetic domains near the magnetic stack. The utilization of multiple ferromagnetic layers separated by a transition metal layer can minimize magnetic stack demagnetization while increasing the magnetoresistive ratio of the stack by biasing the free layers in a substantially orthogonal relationship.

Moreover, the option of utilizing a SAF and alternating side shield lamination allows for high degrees of tunability for a magnetic element that can result in precise element operation. The inclusion of the lateral side shields that function to concurrently bias and shield the magnetic stack acts to reduce the shield-to-shield spacing, which corresponds to greater magnetic element capabilities in the face of ever increasing areal bit densities on recording media.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic element comprising a magnetically responsive stack comprising first and second magnetically free layers and without a fixed magnetization, each layer of the magnetically responsive stack meeting at one of a plurality of stack interfaces oriented parallel to a cross-track direction, each magnetically free layer biased to a predetermined default magnetization and shielded from magnetic flux by a first side shield, the first side shield positioned on a first lateral side of and separated from the magnetically responsive stack, the first side shield comprising first and second transition metal layers respectively disposed between first and second pairs of ferromagnetic layers, each layer of the first side shield meeting at one of a plurality of shield interfaces oriented parallel to the cross-track direction, each stack interface offset from each shield interface along a down-track direction perpendicular to the cross-track direction.

2. The magnetic element of claim 1, wherein at least one transition metal layer is Ru.

3. The magnetic element of claim 1, wherein each pair of ferromagnetic layers comprises a NiFe layer and a NiCoFe layer.

4. The magnetic element of claim 1, wherein the predetermined default magnetization is solely provided by the first side shield and a second side shield positioned on an opposite side of the magnetically responsive stack from the first side shield.

5. The magnetic element of claim 1, wherein the magnetically responsive stack has a non-magnetic spacer layer disposed between the first and second magnetically free layers.

6. The magnetic element of claim 5, wherein each layer of the first side shield has an offset alignment with the spacer and magnetically free layers of the magnetically responsive stack, the offset alignment corresponding a thickness of a seed layer of the first side shield.

7. The magnetic element of claim 1, wherein the first side shield is spaced apart from the magnetically responsive stack by a non-magnetic insulating layer.

8. A method comprising configuring a first side shield with first and second transition metal layers respectively disposed between first and second pairs of ferromagnetic layers to shield and bias first and second magnetically free layers of a magnetically responsive stack to a predetermined default magnetization, the first side shield positioned on a first lateral side of and separated from the magnetically responsive stack, the first pair of ferromagnetic layers comprising first and second ferromagnetic layers and the second pair of ferromagnetic layers comprising third and fourth ferromagnetic layers, each layer of the first side shield meeting at one of a plurality of shield interfaces oriented parallel to a cross-track direction, the magnetically responsive stack configured without a fixed magnetization and with each layer of the magnetically responsive stack meeting at one of a plurality of stack interfaces oriented parallel to the cross-track direction, each stack interface offset from each shield interface.

9. The method of claim 8, wherein at least one transition metal layer has a predetermined thickness that corresponds to a predetermined exchange coupling energy that provides continuous antiferromagnetic coupling throughout the first side shield.

10. A magnetic element comprising:
   a magnetically responsive stack comprising first and second magnetically free layers separated by a non-magnetic spacer layer and configured without a fixed magnetization, each layer of the magnetically responsive stack meeting at one of a plurality of stack interfaces oriented parallel to a cross-track direction; and
   a first side shield comprising first and second transition metal layers respectively disposed between first and second pairs of ferromagnetic free layers each positioned on a single laterally adjacent side of the stack to shield the stack from magnetic flux and to bias the first and second magnetically free layers to a predetermined default magnetization, each layer of the first side shield meeting at one of a plurality of shield interfaces, each stack interface offset from each shield interface.

11. The magnetic element of claim 10, wherein each transition metal layer is a transition metal that couples to the first and second pairs of ferromagnetic layers respectively with Ruderman-Kittel-Kasuya-Yoshida (RKKY) coupling.

* * * * *